(12) United States Patent
Hsia et al.

(10) Patent No.: US 6,813,752 B1
(45) Date of Patent: Nov. 2, 2004

(54) METHOD OF DETERMINING CHARGE LOSS ACTIVATION ENERGY OF A MEMORY ARRAY

(75) Inventors: Edward Hsia, Saratoga, CA (US); Darlene G. Hamilton, San Jose, CA (US); Wei Zheng, Santa Clara, CA (US); Mark W. Randolph, San Jose, CA (US); Kulachet Tanpairoj, Fukushima (JP)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/306,667

(22) Filed: Nov. 26, 2002

(51) Int. Cl.[7] .......................... G06F 17/50; G01R 31/26
(52) U.S. Cl. .................. 716/4; 716/4; 438/17
(58) Field of Search ............... 716/4; 714/720, 714/718; 700/82; 438/758, 593, 3, 17; 430/30; 400/124.05; 365/201, 185.24, 185.18, 185.03, 185.01; 361/311; 356/632; 324/658; 29/852; 257/393, 295; 252/519.2; 174/264

(56) References Cited

U.S. PATENT DOCUMENTS

| | | | | |
|---|---|---|---|---|
| 5,104,819 A | * | 4/1992 | Freiberger et al. | 438/593 |
| 5,700,698 A | * | 12/1997 | Barsan et al. | 438/17 |
| 6,075,724 A | * | 6/2000 | Li et al. | 365/185.18 |
| 6,275,960 B1 | * | 8/2001 | Cappelletti et al. | 714/718 |
| 6,347,053 B1 | * | 2/2002 | Kim et al. | 365/185.24 |
| 6,385,084 B1 | * | 5/2002 | Tamada et al. | 365/185.03 |
| 6,455,904 B1 | * | 9/2002 | Noda | 257/393 |
| 6,590,811 B1 | * | 7/2003 | Hamilton et al. | 365/185.22 |
| 6,618,290 B1 | * | 9/2003 | Wang et al. | 365/185.28 |

OTHER PUBLICATIONS

Vigrass, William J., "Calculation of Semiconductor Failure Rates," unknown date, unknown publication.

* cited by examiner

*Primary Examiner*—Vuthe Siek
*Assistant Examiner*—Helen Rossoshek

(57) ABSTRACT

A method of determining charge loss activation for a memory array. Memory arrays are programmed with a pattern for testing charge loss. Then, respective bake times are calculated for the memory arrays to experience a given amount of charge loss at their respective bake temperatures. Then, charge loss activation energy is calculated, based on the respective bake times. In one version, the memory arrays are cycled by repeatedly erasing and reprogramming them before baking. In another embodiment, various regions of the memory arrays are programmed to a plurality of distinct delta threshold voltages before baking.

26 Claims, 7 Drawing Sheets

| Time | Temp 1 | Temp 2 | Temp 3 | Temp 4 | Temp 5 | Temp 6 |
|---|---|---|---|---|---|---|
| a | 0.47 | 0.65 | 0.78 | 0.91 | 0.95 | 0.99 |
| b | 0.54 | 0.71 | 0.80 | 0.91 | 0.95 | 1.22 |
| c | 0.70 | | 1.10 | 1.23 | 1.26 | 1.53 |
| d | 0.76 | 0.91 | 1.14 | 1.31 | 1.42 | 1.62 |
| e | 0.79 | 0.91 | 1.13 | 1.53 | 1.61 | 1.89 |
| f | 0.79 | 1.09 | 1.18 | 1.58 | 1.69 | |
| g | 0.83 | 1.13 | 1.23 | | | |
| h | 0.87 | 1.13 | 1.27 | | | |
| i | 0.96 | 1.13 | 1.42 | | | |
| x | 1500 | 366 | 12.4 | 1.89 | 1.29 | 0.5 |
| ln(x) | 7.313 | 5.817 | 2.514 | 0.636 | .025 | -0.69 |

| Cycles | Temp Range | Fitted Equation | Calculated $E_a$ |
|---|---|---|---|
| A | All temps | Y = 11.964x - 27.088 | 1.03 eV |
| B | All temps | Y = 12.174x - 25.941 | 1.05 eV |
| C | All temps | Y = 11.332x - 22.502 | 0.98 eV |
| D | α | Y = 6.9457x - 12.16 | 0.60 eV |
| | β | Y = 29.331x - 58.321 | 0.53 eV |
| E | α | Y = 6.1931x - 10.287 | 5.15 eV |
| | β | Y = 59.72x - 122.89 | |
| F | α | Y = 7.6266x - 14.438 | 0.66 eV |
| | β | Y = 68.688x - 147.11 | 5.92 eV |
| G | α | Y = 8.0086x - 14.715 | 0.69 eV |
| | β | Y = 71.974x - 153.82 | 6.20 eV |

700

METHOD OF DETERMINING CHARGE LOSS ACTIVATION ENERGY OF A MEMORY ARRAY

TECHNICAL FIELD

The present invention generally pertains to the field of memory arrays. More particularly, embodiments of the present invention are related to a method of determining a charge loss activation energy for a memory array.

BACKGROUND ART

For some time it has been possible to fabricate memory devices such as flash memory that are both reprogrammable and retain their charge when power is removed. Such devices are highly desirable and have many applications from storing a computer system's BIOS to functioning as a memory for devices such as digital cameras. Typically, such memory devices may be reprogrammed hundreds of thousands of times.

Such devices may operate by storing a charge in a memory cell. For example, a typical flash memory cell may be programmed to hold a charge in a floating gate region of a transistor. Clearly, the ability of the memory cells to retain their charges is paramount to memory array performance. Such memory arrays may tend to lose their ability to hold charge, based on factors such as number of times reprogrammed, age, temperature, etc.

It is desirable to estimate the useful life of such memory arrays. In this fashion a manufacturer may provide a customer with data, such as a projected number of times the memory array may be reprogrammed, suggested ranges of operating temperatures, projected amount of time a device will retain its charge, etc. In order to provide such information, it is conventional to perform calculations using an activation energy for the particular product and conditions.

One such conventional technique is to test the device under high temperatures and then estimate the device's useful life under normal temperatures. Conventionally, this estimate may be based on the Arrhenius equation, which may be used to describe physio-chemical reaction rates. The Arrhenius equation may be expressed as:

$$A = \exp[E_a/k(1/T_u - 1/T_e)] \qquad \text{Equation 1:}$$

Where in equation 1, A is the acceleration factor, $E_a$ is the activation energy, k is Boltzmann's constant, $T_u$ is the temperature of normal use in Kelvin, and $T_e$ is the temperature during experimentation in Kelvin.

The activation energy will depend on characteristics of the mechanism being studied. In many cases, when a new technology is manufactured, the activation energy is merely estimated by using the value from a similar technology for which actual testing has been performed. However, the new technology may, in fact, have a very different activation energy. In some cases, the value of the activation energy is based on experimental evidence that may be decades old. Given the rapid changes in technique in fabricating semiconductor devices, relying upon data from a similar technology or old data is clearly suspect. Hence, any calculation for product lifetimes is unreliable.

Significantly, as the activation energy depends on the characteristics of the technology, the methodology to test for activation energy will be different for technologies with different characteristics. For example, flash memory or the like may have a failure mode associated with individual memory cells losing or gaining charge.

Thus, a need has arisen for a method to determine the activation energy for a memory device. A further need exists for a method for determining the activation energy for a memory device that stores charge, such as a flash memory. A need exists for determining the activation energy.

DISCLOSURE OF THE INVENTION

Embodiments of the present invention provide a method of calculating activation energy of a memory array. Embodiments provide a method of calculating activation energy of a memory array, as a function of program/erase cycles and differing technologies. The memory array may store charge, such as a flash memory. In one embodiment, the memory cells are capable of storing two separate bits by storing charge in two locations.

A method of determining charge loss activation for a memory array is disclosed. First, a first and a second memory array are programmed with a pattern for testing charge loss. Then, respective bake times are calculated for the first and the second memory arrays to experience an arbitrary amount of charge loss at respective first and second temperatures. Then, a charge loss activation energy is calculated, based on the respective bake times to lose the arbitrary amount of charge at the respective first and second temperatures.

In one embodiment, calculating respective bake times for the first and second memory arrays to experience the arbitrary amount of charge loss is performed as follows. The first memory array is baked at the first temperature for a plurality of time intervals. The charge loss is calculated for each of the time intervals. Then, the bake tile for the first memory array to experience the arbitrary amount of charge loss is calculated, based on the previous calculation. The second memory array may be processed in a similar fashion at the second temperature.

In another embodiment, the memory arrays are cycled by repeatedly erasing and reprogramming them before baking. A variety of different number of cycles are used, in various embodiments.

In yet another embodiment, various regions of the first or second memory arrays are programmed to a plurality of distinct delta threshold voltages before baking. For example, the difference in the transistor threshold voltages between the cells that are programmed to a first value and the transistor threshold voltages of cells that are programmed to a second value is programmed to a different value on different regions of the memory array.

These and other advantages of the present invention will no doubt become obvious to those of ordinary skill in the art after having read the following detailed description of the preferred embodiments which are illustrated in the various drawing figures.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Embodiments of the present invention provide for a method of calculating an activation energy for a memory array. The memory array may be capable of storing charge in two locations per memory cell transistor. Various embodiments provide for calculating an activation energy using different variables. Some of the variables that may be used include, but are not limited to, using different bake temperatures, cycling wafers a different number of times before baking, baking for different intervals, programming different portions of wafers to different pre-bake delta threshold voltages, and creating a separate delta threshold voltage distribution for distinct portions of the wafer by aggregating data from reading the distinct portions.

Figure 1:
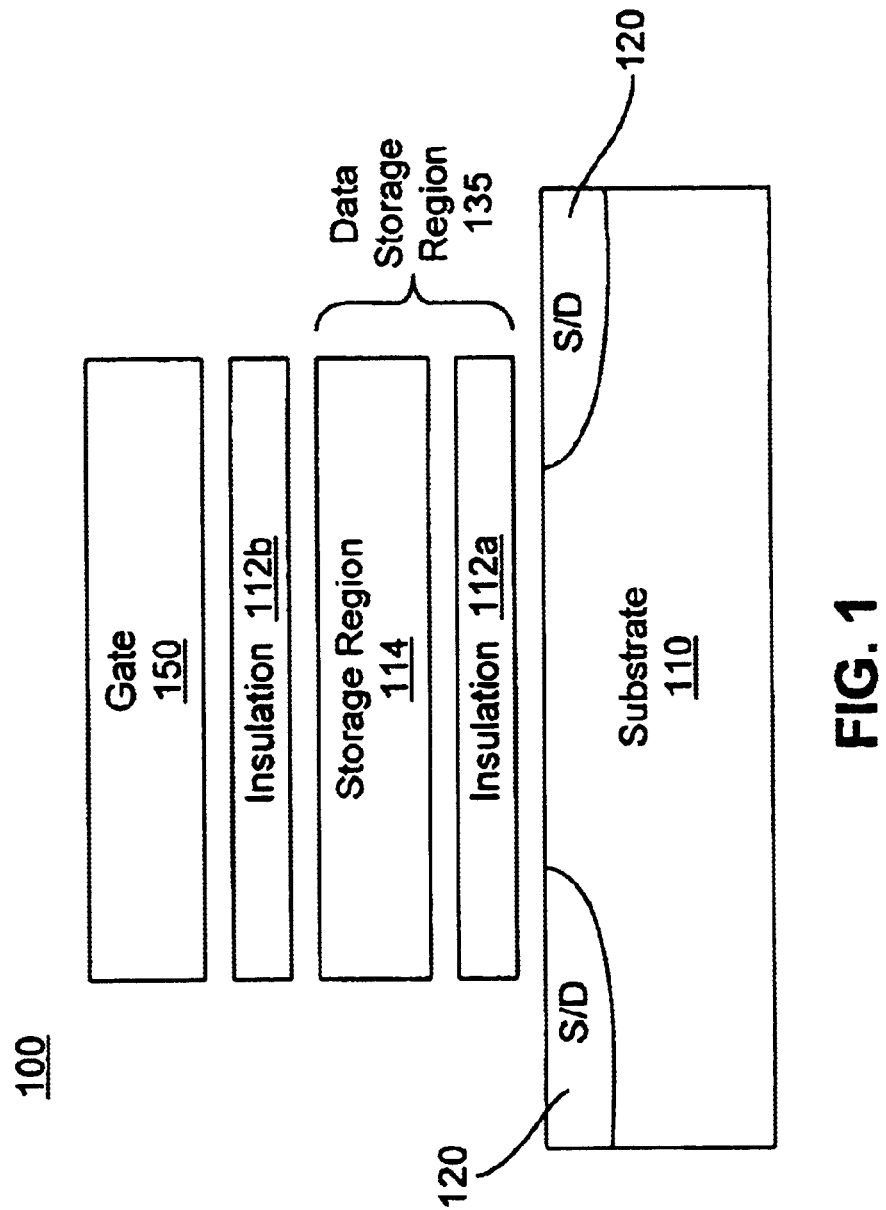
FIG. 1 is a diagram of an exemplary memory cell for which charge loss activation energy may be calculated according to embodiments of the present invention.

FIG. 1 illustrates an exemplary memory cell 100 that may store two bits of information. Embodiments of the present invention calculate a charge loss activation energy for a device comprising such memory cells 100, although embodiments of the present invention are not limited to such memory cells 100. The memory cell 100 comprises a substrate 110 and a pair of selectable source/drain regions 120. The source/drain regions 120 may be constructed symmetrically and a given source/drain region 120 may operate as either a source or a drain, depending on operating conditions. Above the substrate 110 is a data storage region 135 comprising a charge storage region 114 sandwiched between two insulating layers 112a, 112b. The charge storage region 114 may comprise silicon nitride (SiN) and the insulating layers may comprise silicon dioxide ($SiO_2$). Above the data storage region 135 is a gate 150 that may comprise polysilicon.

Still referring to FIG. 1, the charge storage region 114 may have a low conductivity. A separate charge may be stored on two distinct locations in the charge storage region 114. The charges may be on the left and right side of the charge storage region 114. Memory cells 100 such as the MirrorBit™ technology, provided by Advanced Micro Devices of Sunnyvale, Calif. are capable of such charge storage. Embodiments of the present invention are not limited to the exemplary memory cell 100 of FIG. 1.

Figure 2:
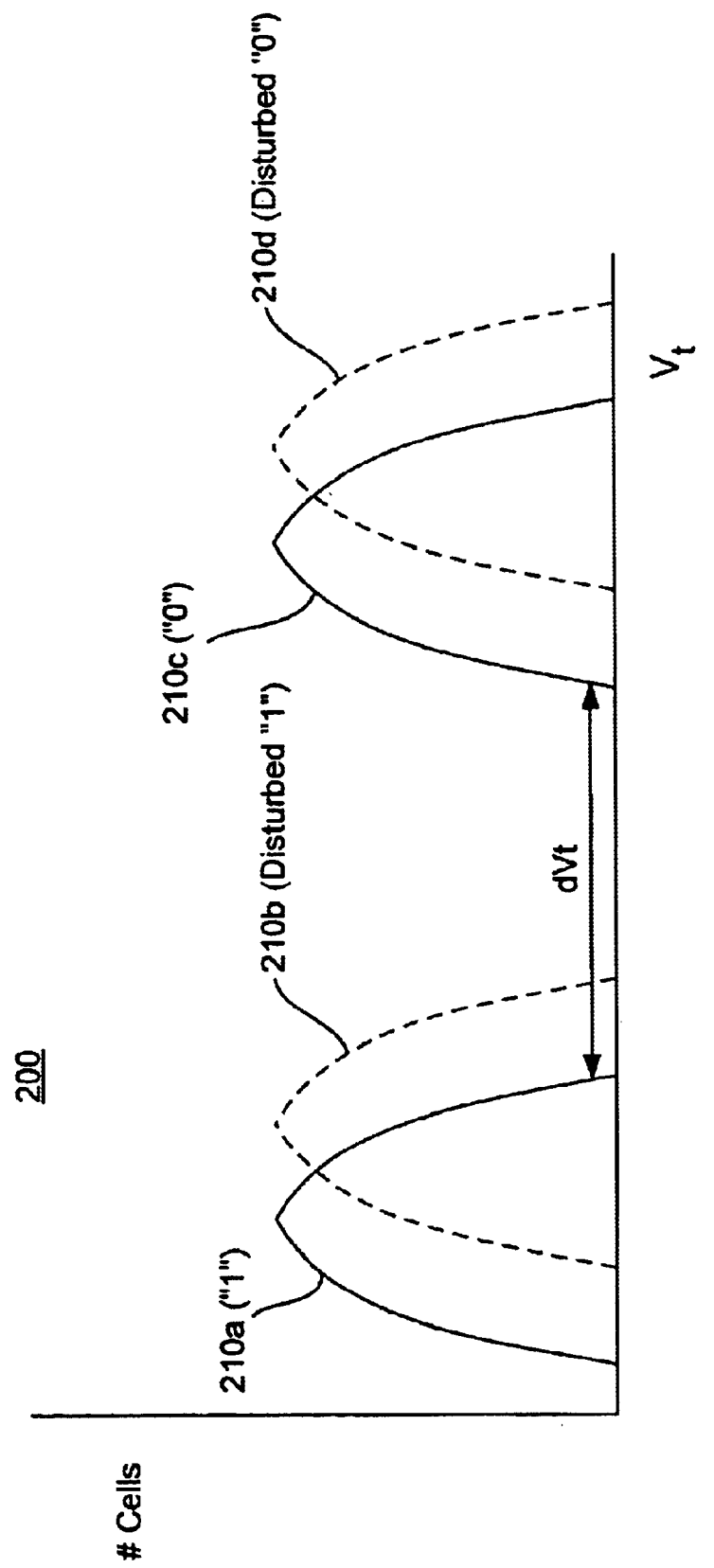
FIG. 2 is a diagram illustrating distributions of threshold voltages and a delta threshold voltage therebetween.

Data retention is a basic concern with flash type memories, such as the exemplary memory cell 100 of FIG. 1. FIG. 2 illustrates a graph 200 of separate voltage threshold ($V_t$) distributions. The $V_t$ distributions may be the transistor threshold voltages of a collection of memory cells 100 that have the same bit value. The "1" distribution 210a may be derived from the $V_t$ of a number of memory cells 100 that have been programmed to a first value, for example "1". The "0" $V_t$ distribution 210c may be derived from a number of memory cells 100 that have been programmed to a second value, for example "0". The disturbed "1" $V_t$ distribution 210b and the disturbed "0" $V_t$ distribution 210d may be derived from memory cells 100 that are in disturbed conditions and will be described more fully below.

In typical operation, to program a given memory cell 100, a number of voltage pulses are applied to the gate 150, for example. This may cause charge to be stored in a data storage region 135 of the memory cell 100. An effect of this charge storage may be to increase the $V_t$ of the transistor. The $V_t$ may be tested by applying greater and greater read voltages until the transistor conducts. Alternatively, the $V_t$ may be tested by applying lesser and lesser read voltages until the transistor fails to conduct. In this fashion, a memory cell 100 may be programmed up to a desired $V_t$ to store one or more bits of information.

If a memory cell 100, such as the one in FIG. 1 or the like, is being programmed, each side of the storage region 114 may be separately programmed and store a separate charge. There may be two separate threshold voltages, a first $V_t$ for one side of the data storage region 135 and related to the voltage needed between the gate 150 and one source/drain 120 for the transistor to conduct and a second $V_t$ for the other side of the data storage region 135 and related to the voltage needed between the gate 150 and the other source/drain 120 for the transistor to conduct.

In FIG. 2, the "0" $V_t$ distribution 210c has been programmed to provide a desired delta $V_t$ ($dV_t$) between the "1" $V_t$ distribution 210a and the "0" $V_t$ distribution 120c. Over time, the "1" $V_t$ distribution 120a on the right may drift to the left, if the charge storage region 114 loses charge. Embodiments of the present invention measure the charge loss under various conditions to calculate charge loss activation energy.

Still referring to FIG. 1, when using a MirrorBit™ memory cell 100 or the like, one bit of a transistor may be disturbed when the bit on the other side of the data storage region 135 (e.g., its companion) is programmed or erased. For example, the disturbed "1" $V_t$ distribution 210b may illustrate what happens to the "1" $V_t$ distribution 210a after their companion bits are programmed to a "0". Further, the disturbed "0" $V_t$ distribution 210d may illustrate what happens to the "0" $V_1$ distribution 210c alter their companion bits are programmed to a "0". Embodiments of the present invention collect data to determine a charge loss activation energy for effects that may occur due to the various ways in which the memory cells 100 may be programmed.

Figure 3:
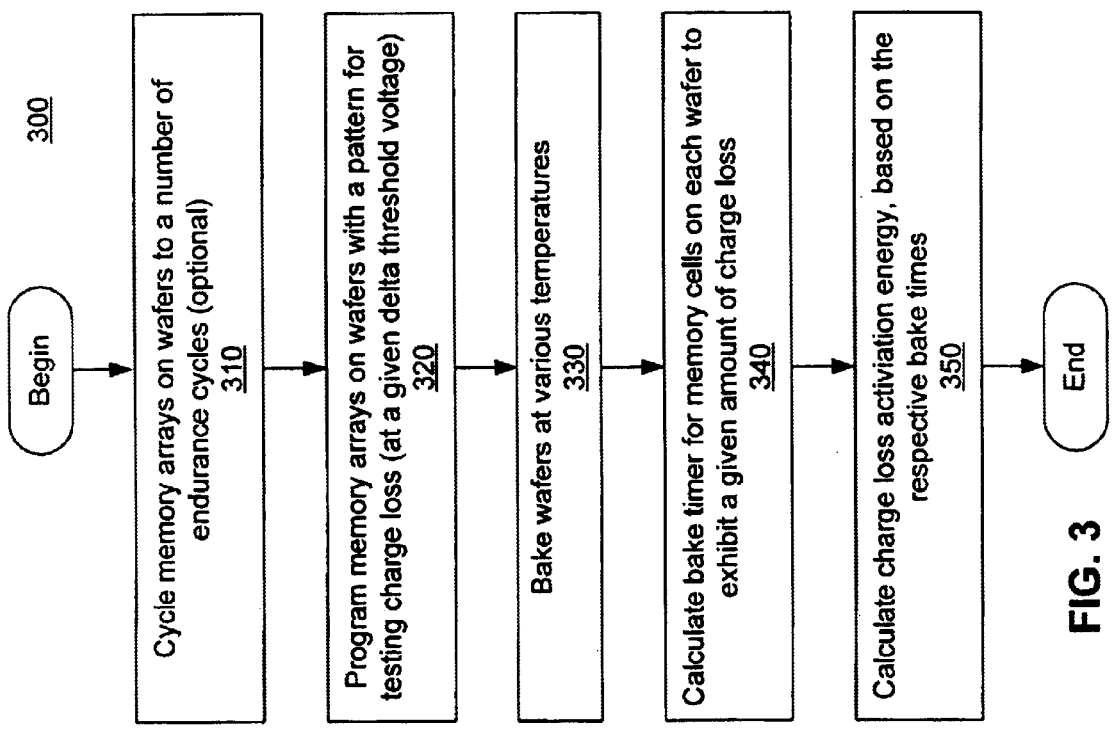
FIG. 3 is a flowchart illustrating steps of a process of calculating charge loss activation energy, according to an embodiment of the present invention.

FIG. 3 shows a flowchart of a process 300 for calculating activation energy. In optional step 310, a number of wafers are cycled out to a number of endurance cycles (e.g., they may be programmed and erased a given number of times). While, this step 310 does not need to be performed to calculate a charge loss activation energy, data may be collected separately, for each number of endurance cycles. For example, wafers may be cycled over a suitable range of cycles. This maybe millions of cycles, but this is not limiting. The delta $V_t$ to which the memory cells 100 are programmed may be selected as desired.

Advantageously, cycling the wafers as in step 310 may help to determine causes of failure that are undetectable without performing the endurance cycling. For example, it may be that a given technology has multiple causes of failure and that the effect of one or more causes does not appear unless the wafers are cycled a greater number of times. As discussed herein, in some cases, the activation energy may tend to saturate if the wafer is subjected to enough endurance cycles.

In step 320, the memory arrays on various wafers under test are programmed with a pattern to test charge loss. In one embodiment, a checkerboard pattern is used. There are many types of checkerboard patterns. These patterns may allow for transitions between ones and zeroes and have been found to be an effective way to test memory cells 100. However, embodiments are not limited to such patterns. In one embodiment, one side of a MirrorBit™ memory cell 100 or the like is programmed to a "1" and the other side to a "0". In this fashion, the effect that charging one half of the memory cell 100 has on the other half may be studied in terms of activation energy. In another embodiment, each side of a MirrorBit™ memory cell 100 or the like is programmed to the same value. The value may alternate between adjacent transistors.

The wafers may be programmed such that different regions are programmed to different predetermined delta threshold voltages. For example, various regions may be programmed to 1.5V delta $V_t$, 2.0V delta $V_t$, 2.5V delta $V_t$, and 3.0V delta $V_t$, but these values are not limiting. These delta $V_t$ values are not necessarily the same values to which the various regions were cycled to in step 310, if that step 310 was taken. In fact, the process 300 may be simplified by always cycling the wafers to the same delta $V_t$.

In step 330, the wafers are separately baked at different temperatures. Baking at different temperatures may provide data with which to calculate a charge loss activation energy. The range of temperature may be from 100 degrees Celsius to 250 degrees Celsius, although temperatures outside this range may be suitable.

Each wafer may be removed from baking for brief periods from time to time to take readings of how much charge has been lost over various time intervals. These data may be used to calculate the amount of time it would take to lose an arbitrary amount of charge for each of the waters being baked at different temperatures. Thus, in step 340, a time value is produced that is the amount of time needed for each of the wafers to lose an arbitrary amount of charge. Any convenient value may be used.

In step 350, a charge loss activation energy is calculated based on the results from the previous step 340. This may involve data from wafers baked different temperatures. In one embodiment, the calculation is performed by plotting a line formed by the estimated bake times to lose an arbitrary amount of charge in step 340. More details of such a calculation are discussed below. Process 300 then ends.

Figures 4, 7:
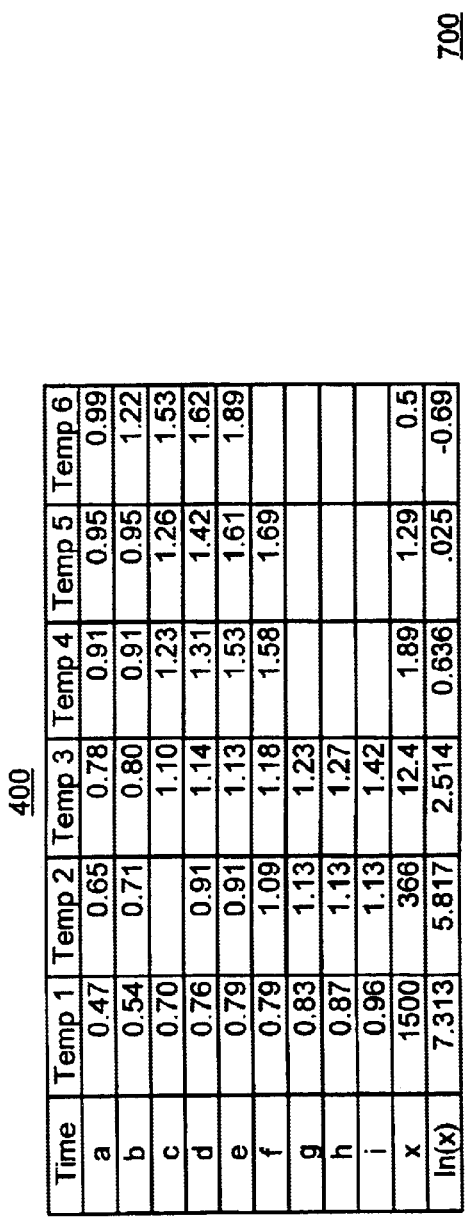
FIG. 4 is a table of exemplary data that may be used to calculate charge loss activation energy, according to an embodiment of the present invention.
FIG. 7 is a table of exemplary results illustrating relationships between number of cycles and corresponding activation energy, according to an embodiment of the present invention.

Table 400 of FIG. 4 illustrates exemplary data that may be collected during a process such as process 300 of FIG. 3.

Each column of table 400 comprises data for the amount of charge loss that was measured for a wafer (or portion thereof) baked at a given temperature. In this case, wafers were baked at six different temperatures. For each temperature, data were collected after a specified amount of time for baking the wafer. In this case, data were collected out to 1000 hours, but this is not limiting. Data may be collected at any suitable times.

From the data in a given column in FIG. 4, an amount of time for the memory cells 100 to lose an arbitrary amount of charge may be calculated. This may be expressed in the second from bottom row of the table 400, which is designated with a time value of 'x' in the first column. For example, in the column for "Temp 1", the value in the bottom row is 1500 hours, which is an estimate of the amount of time to lose the pre-determined amount of charge. Those of ordinary skill in the art will recognize that the amount of charge loss may be any convenient value. Such an estimate may be made for each of the wafers being baked at a different temperature.

The table 400 in FIG. 4 was derived from a die that was cycled a given number of times before baking. Similar tables may be constructed for dies that were cycled to other endurance numbers. A separate charge loss activation energy may be calculated for each such die.

Figure 5:
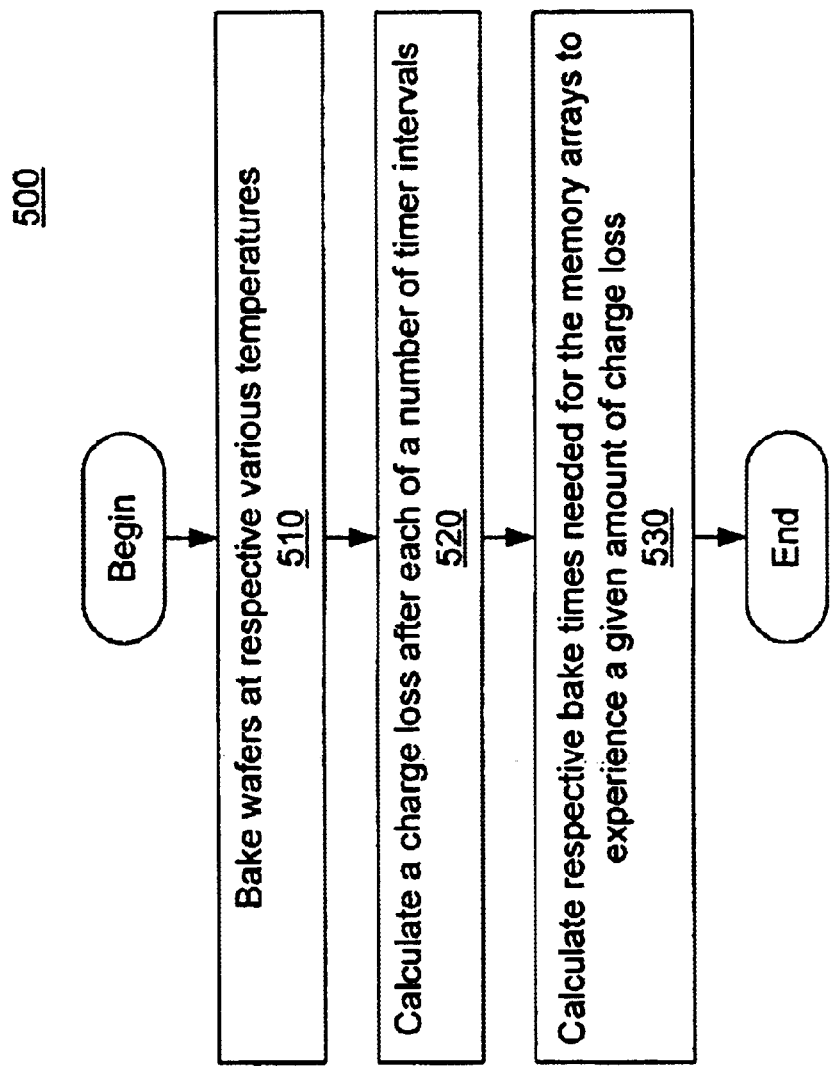
FIG. 5 is a flowchart illustrating steps of a process of calculating bake time for a wafer to exhibit a given charge loss, according to an embodiment of the present invention.

FIG. 5 is a flowchart illustrating a process 500 of calculating an amount of bake time for a wafer to lose an arbitrary amount of charge. Such an embodiment may be used in the implementation of step 340 of process 300. In step 510 of FIG. 5, a number of wafers having memory arrays are baked at a variety of temperatures (one temperature per wafer).

In step 520, the wafers are removed at various points in time to measure the amount of charge loss. The charge loss may be defined as the change in $dV_t$. These data may be used to fill in a table such as table 400 of FIG. 4.

In step 530, an estimate is made of the amount of time each wafer would need lo lose some arbitrary amount of charge. Process 500 then ends.

Figure 6:
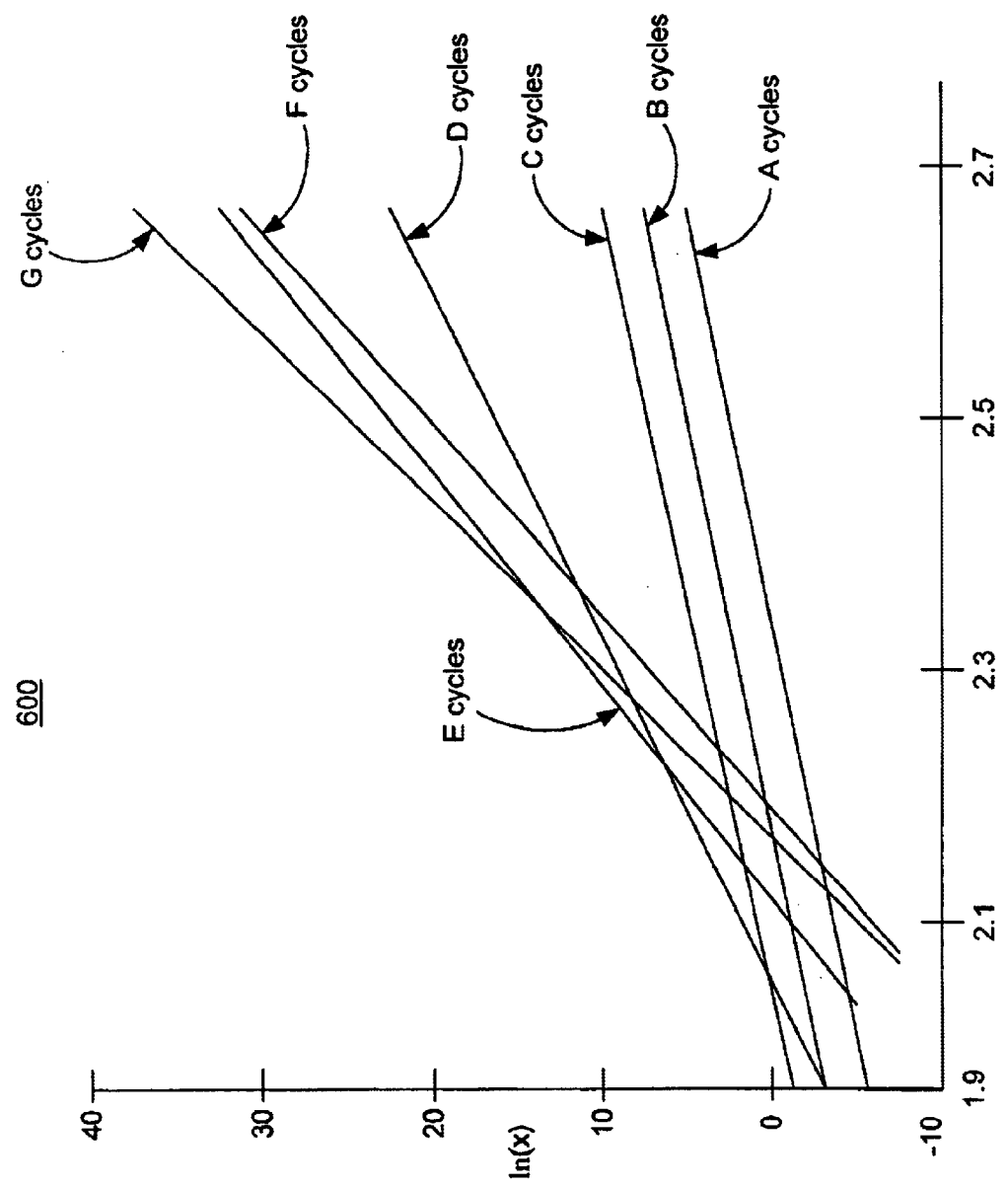
FIG. 6 is a graph illustrating calculation of activation energy, according to an embodiment of the present invention.

FIG. 6 illustrates a graph 600 that may be constructed, based on the data from table 400 of FIG. 4. Charge loss activation energy maybe taken from the slope of the various lines in the graph 600. The x-axis of the graph 600 is 1000/T, where T is expressed in Kelvins. The y-axis is ln(x), where 'x' is the amount of time for a wafer to loss an arbitrary amount of charge. For example, 1.0 volts may be used. However, other amounts may be used with a suitable modification to the constants used in the graph 600. The rationale for plotting these lines may be as follows.

The shift in threshold voltage, $dV_t$ may be expressed as in equation 2 and applied to the Arrhenius equation, which is shown in equation 3.

$$dV_t = a^* \ln(x) + b \qquad \text{Equation 2:}$$

$$x = A^* \exp(-E_a/kT) \qquad \text{Equation 3:}$$

In equations 2 and 3, $dV_t$ is the shift in threshold voltage, 'x' is the amount of time to lose 1.0 volts of charge, 'a' and 'b' are constants, k is Boltzmann's constant, T is temperature, A is the acceleration factor, and $E_a$ is the activation energy. By applying equation 2 to equation 3, the activation energy may be calculated according to equation 4.

$$E_a = [k^*(\ln(t_{t1}) - \ln(t_{t2}))]/(1/T_1 - 1/T_2) \qquad \text{Equation 4:}$$

In equation 4, $t_{t1}$ and $t_{t2}$ are the time to failure for two (or more) populations. In equation 4, the linear trend lines are the lines shown in FIG. 6 of ln(x) versus 1000/T. In FIG. 6 exemplary lines have been plotted for data collected in which the wafers were cycled to various number of endurance cycles before baking.

In another embodiment of the present invention, data is collected for memory cells with different dimensions from the rest of the memory cells 100 under test. In this fashion, the affect that fabricating memory cells 110 with different dimensions has on activation energy may be studied.

Table 700 of FIG. 7 illustrates exemplary results illustrating a relationship between number of cycles and corresponding charge loss activation energy. From the table 700, it is observed that for endurance cycles A–C, the charge loss activation energy is saturated at about 1 eV. For some of the cycles (e.g., D–G), separate fitted lines are calculated, due to the non-linearity of the plots. In these cases, a separate fitted line may be calculated for bake temperatures in different temperature ranges. For example, in table 700 a separate line is calculated for temperature ranges α and β for endurance cycles D–G.

Table 700 in FIG. 7 further reveals that at temperature range α, die cycled to D–G cycles have charge loss activation energies ranging from 0.5–0.7 eV. At temperature range β, die cycled to D–G cycles exhibit energies ranging from 5–6 eV.

Referring again to the process 300 of collecting charge loss data in FIG. 3, an embodiment of the present invention collects data based on the location of the memory cells 100. For example, in some embodiments, the data for one box in FIG. 4 may be collected from every memory cell 100 in a wafer or portion thereof, for which the particular parameters (e.g., number of cycles, initial $V_t$, etc.) are the same. However, in other embodiments the data is collected for selected memory cells 100. This may allow observation of variations in the characteristics in memory cells.

Figure 8:
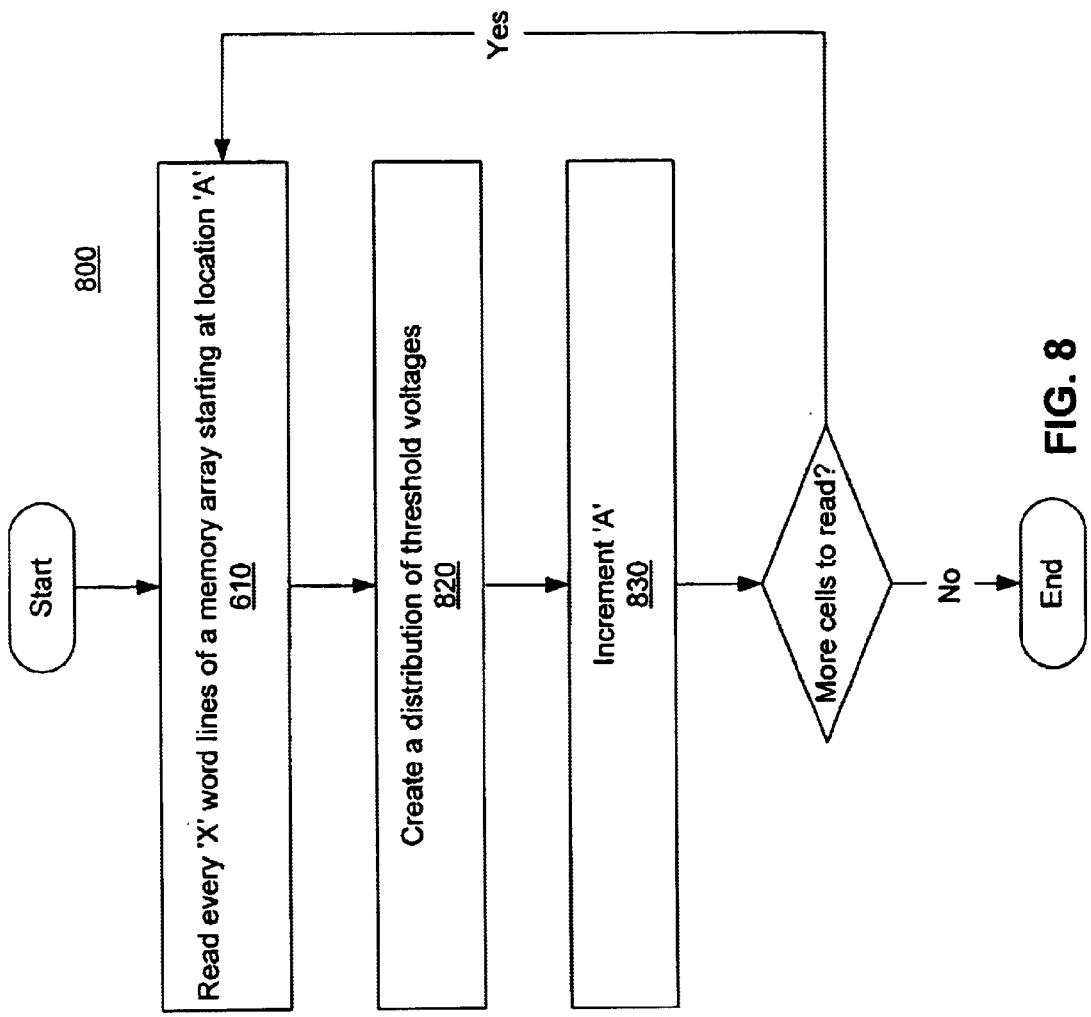
FIG. 8 is a flowchart illustrating steps of a process of collecting data to create voltage threshold distributions for calculating charge loss activation energy, according to embodiments of the present invention.

Referring now to process 800 of FIG. 8, in step 810 data are collected for every 'x' wordlines of a memory array starting at arbitrary location 'A'. For example, all of the memory cells 100 at wordlines that are multiples of 'x' plus an increment 'A' are tested for charge loss by measuring their $V_t$. Any other specific region may be separately tested instead.

In step 820, a distribution of data is created for the data collected in step 820. For example, a separate $V_t$ distribution is created for the memory cells 100 just read. This data may be used in the construction of a table such as the one in FIG. 4.

In step 830, the increment 'A' is incremented and the process 800 returns to step 810. The process 800 continues until all memory cells 100 have been read. Thus, process 800 allows the collected data to focus on portions of the memory array that are of interest. It will be clear that other schemes may be used to focus the data collection on other regions of a memory array.

Therefore, it will be seen that embodiments of the present invention provide a method of calculating activation energy of a memory array. Embodiments of the present invention calculate charge loss activation energy for memory cells that are capable of storing two separate bits by storing charge in two locations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of determining charge loss activation energy for a technology, comprising:
   a) programming a first memory array and a second memory array with a pattern for testing charge loss, wherein said first and second memory arrays represent a given technology;
   b) calculating respective bake times for said first and said second memory arrays to experience an arbitrary amount of charge loss at respective first and second temperatures; and
   c) calculating charge loss activation energy for the technology represented by the first and second memory arrays, based on said respective bake times to lose said given amount of charge at said respective first and second temperatures.

2. A method according to claim 1, wherein said b) comprises:
   b1) baking said first memory array at said first temperature for a plurality of time intervals;
   b2) calculating a loss of charge for each of said time intervals; and
   b3) calculating said bake time for said first memory array to experience said arbitrary amount of charge loss, based on said calculation in said b2).

3. A method according to claim 1, wherein:
   said a) further comprises cycling said first memory array and said second memory array by repeatedly erasing and reprogramming said first memory array and said second memory array.

4. A method according to claim 1, wherein:
   said a) further comprises cycling different portions of said first memory array and said second memory array for different numbers of cycles, wherein said charge loss activation energy is calculated for each of said different numbers of cycles.

5. A method according to claim 1, wherein said a) further comprises:
   programming cells of said first memory array and said second memory array to a pre-determined delta threshold voltage.

6. A method according to claim 1, wherein said a) further comprises programming a plurality of regions of said first memory array to a plurality of distinct threshold voltages.

7. A method according to claim 1, wherein said first and said second memory arrays are operable to store a plurality of bits per memory cell.

8. A method according to claim 1, wherein said pattern comprises two distinct values per memory cell.

9. A method according to claim 1, wherein said c) comprises:
   calculating said charge loss activation energy using data from substantially all of said first memory array and said second memory array.

10. A method according to claim 1, wherein said c) comprises:
    calculating said charge loss activation energy using data from a portion of said first memory array and said second memory array.

11. A method according to claim 10, wherein said portion comprises a group of word lines that are separated from each other by a pre-determined number of wordlines.

12. The method of claim 1, further comprising applying said charge loss activation energy for the technology represented by the first and second memory arrays to determine a figure of merit for the technology.

13. The method of claim 12, wherein the figure of merit comprises a projected number of times memory arrays of the technology may be reprogrammed.

14. The method of claim 12, wherein the figure of merit comprises suggested ranges of operating temperatures for the technology.

15. The method of claim 12, wherein the figure of merit comprises a projected amount of time a memory array will retain its charge for the technology.

16. A method of determining charge loss activation energy for a type of memory, comprising:
- a) programming a first memory array on a first wafer with a pattern for testing charge loss, wherein memory cells of said memory array are programmed with two bits per cell;
- b) baking said first memory array at a first temperature for a plurality of bake times;
- c) calculating a charge loss for each of said bake times;
- d) estimating a bake time for said first memory array to have an arbitrary amount of charge loss, based on said calculation in said c);
- e) repeating said a)–d) for a second memory array on a second wafer at a second temperature, wherein said first and second memory arrays represent a type of memory; and
- f) calculating said charge loss activation energy for the type of memory, based on said estimated bake times to lose said arbitrary amount of charge at said first temperature and said second temperature.

17. A method according to claim 16, further comprising:
repeating said a)–d) for additional memory arrays on additional wafers at additional temperatures and using data collected therefrom in said charge loss activation energy calculation in said f).

18. A method according to claim 16, wherein said a) comprises:
- a1) programming a first plurality of cells of said first memory array to have a first distribution of voltage thresholds;
- a2) programming a second plurality of cells of said first memory array to have a second distribution of voltage thresholds, wherein a difference between said first distribution and said second distribution is a pre-determined value.

19. A method according to claim 16, wherein said a) comprises programming said first memory array to a checkerboard pattern.

20. A method according to claim 16, wherein a value of said two bits is different from each other.

21. A method according to claim 16, wherein said f) comprises calculating said charge loss activation from a slope of a line formed by said estimated bake times in said d).

22. The method of claim 16, further comprising applying said charge loss activation energy for the type of memory represented by the first and second memory arrays to determine a figure of merit for the type of memory.

23. A method of determining charge loss activation energy for a flash memory, comprising:
- a) programming a plurality of memory arrays on a respective plurality of wafers with a checkerboard pattern for testing charge loss wherein the plurality of memory arrays are representative of the flash memory;
- b) calculating respective bake times for said plurality of memory arrays to experience an arbitrary amount of charge loss at respective temperatures, wherein each wafer is baked at a unique temperature; and
- c) calculating charge loss activation energy for the flash memory that is represented by the plurality of memory arrays, based on said respective bake times.

24. A method according to claim 23, wherein said b) comprises:
- b1) baking a first memory array of said plurality at a first temperature for a plurality of bake times;
- b2) measuring threshold voltages for memory cells of said first memory array programmed to a first value for each of said plurality of bake times;
- b3) measuring threshold voltages for memory cells of said first memory array programmed to a second value for each of said plurality of bake times;
- b4) calculating actual charge loss, based on threshold voltage distributions created from said measurements in said b2) and b3); and
- b5) estimating a bake time of said respective bake times for said first memory array to have said arbitrary amount of charge loss, based on said actual charge loss.

25. A method according to claim 23, wherein said plurality of wafers are manufactured from the same lot.

26. The method of claim 23, further comprising applying said charge loss activation energy for the flash memory represented by the plurality of memory arrays to determine a figure of merit for the flash memory.

* * * * *